(12) United States Patent
Lambiaso

(10) Patent No.: US 6,513,755 B1
(45) Date of Patent: Feb. 4, 2003

(54) METHOD TO INSTALL EQUIPMENT RACKS IN AIRCRAFT

(75) Inventor: Guy A. Lambiaso, Garden Grove, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 09/951,266

(22) Filed: Sep. 13, 2001

(51) Int. Cl.[7] .................................................. B64C 1/20
(52) U.S. Cl. ................................ 244/118.1; 244/129.1; 211/99; 211/168; 211/169
(58) Field of Search ........................... 244/118.1, 129.1; 211/95, 99, 168, 169

(56) References Cited

U.S. PATENT DOCUMENTS

| | | | | |
|---|---|---|---|---|
| 4,562,978 A | * | 1/1986 | Durbin et al. | 244/1 R |
| 4,990,096 A | * | 2/1991 | Bujtas et al. | 2/169 |
| 5,049,891 A | * | 9/1991 | Ettinger et al. | 343/705 |
| 5,810,178 A | * | 9/1998 | Boette et al. | 211/86.01 |
| 6,450,822 B1 | * | 9/2002 | Eller | 439/247 |

* cited by examiner

*Primary Examiner*—J. Woodrow Eldred
(74) *Attorney, Agent, or Firm*—Harness Dickey & Pierce P.L.C.

(57) ABSTRACT

A design and installation method are provided to improve access to equipment mountable on aircraft equipment racks, including installing modified equipment rack framework on the aircraft, preassembling the equipment on a separate equipment package, providing separate matable hinge units on both the framework and equipment package, and temporarily supporting the equipment package in a hanging position from the equipment rack by matably joining the separate hinge units. Wiring the equipment from adjacent wireway banks is performed in the hanging position, followed by rotating the equipment package about an axis of rotation formed by the joined hinge units into a fixed stowed position, and fastening the equipment package to the equipment rack framework to complete the installation.

20 Claims, 6 Drawing Sheets

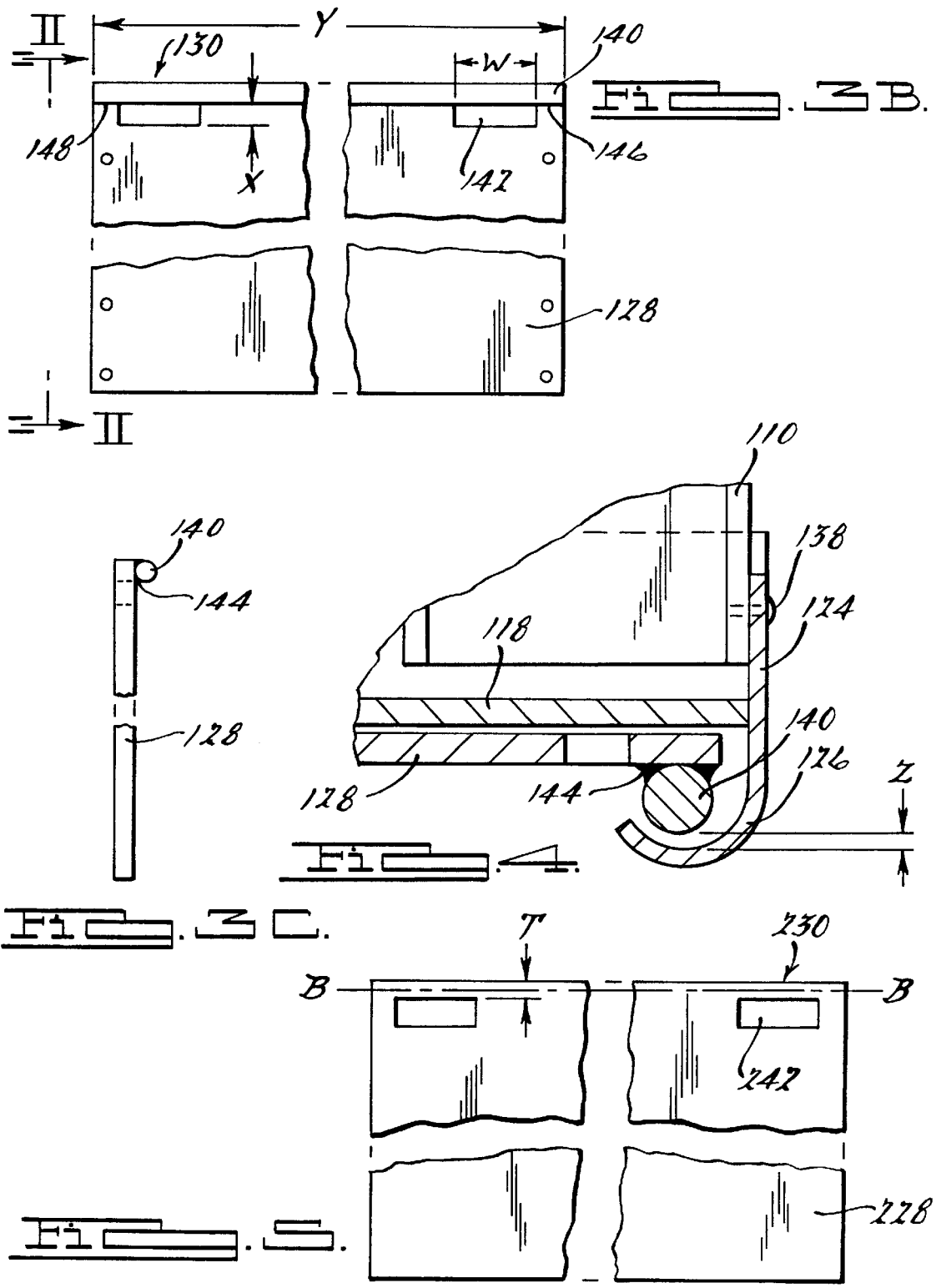

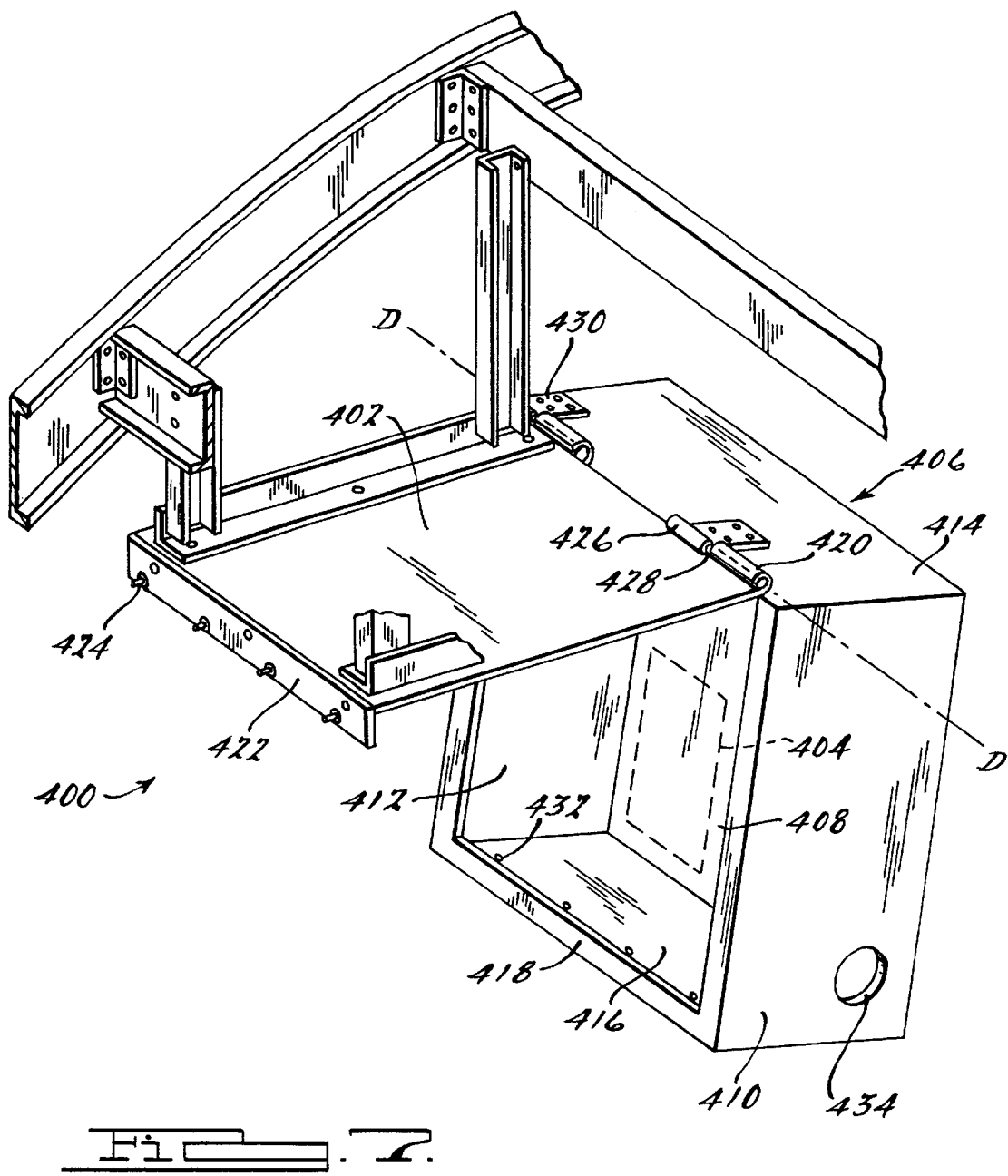

METHOD TO INSTALL EQUIPMENT RACKS IN AIRCRAFT

FIELD OF THE INVENTION

The present invention relates to the design, construction, and method of installation of equipment on equipment racks, and more particularly to the design, construction, and method of installation of equipment on aircraft equipment racks using hinge members to improve access to system connections.

BACKGROUND OF THE INVENTION

The aircraft industry currently employs overhead racks attached to frames or frame structure to support equipment packages adjacent to the aircraft's frames. These racks are typically installed by fastener attachment to the frames, or associated frame structure, prior to installation of the equipment packages. Wiring supporting the equipment packages is typically located in wire hangers supporting wiring banks and brought to general locations where the equipment packages will be located. The individual pieces of equipment are then mounted on the preinstalled racks and typically bolted in position. Following equipment installation on the rack assemblies, an installation mechanic will pull the wiring from the adjacent wiring banks to make connections into the equipment packages. A drawback of the existing rack system is that access for this type of installation is often difficult due to the structure of the rack assembly itself. Access for this type of installation is often made more difficult on existing aircraft, where in addition to the original wiring banks, structure of the rack assembly, and installed equipment, other equipment and structure may have been installed or retrofitted during the service life of the aircraft.

Existing rack assembly designs employ various structural members to support the equipment. Structural members may comprise vertical rails formed of angle shapes and U-shaped channels, flat plate forming equipment shelves, adjustable mounting fittings such as turnbuckle assemblies to locate the racks, and mechanical fasteners to join these members to themselves and the aircraft structure. Generally, aircraft safety requirements provide that additional support structure must be utilized to restrain motion of the rack assemblies. This additional support structure usually comprises diagonal support braces and additional stiffener members. A drawback is that installation of this additional structure, in addition to the vertical supports typically used to support the weight of the rack assembly and equipment package to the aircraft structure, provides a difficult access path for mechanics to reach the equipment to make the wiring and other equipment connections.

On wide body aircraft there is generally sufficient space in the overhead compartments for additional wiring and components for retrofit on the aircraft following initial construction. An example of this includes antenna system installation, which requires, in addition to the two antennas, power converters and power supplies for each. The power converters and power supplies have the additional restriction that their location must be within about two feet of each antenna. Such retrofit requires sufficient space for the equipment structure, the equipment, the necessary wiring, and any mechanical connections. Retrofitting this antenna equipment on existing aircraft, within the space limitation discussed above, must be performed within time constraints of aircraft down time, and with the drawback that surrounding structure and components could limit access into an existing design equipment rack.

There is a need for a less expensive and simpler method to provide the mechanic access to new installation or retrofitted equipment packages to make wiring and mechanical connections. A simpler structural design requiring fewer parts and a method of providing access for wiring interconnect to equipment before it is positioned and fastened to the rack assembly is desirable.

SUMMARY OF THE INVENTION

The present invention addresses these needs and past design drawbacks by providing a rack installation method and design that permits access to the associated equipment for interconnection activity prior to positioning the equipment in its final fixed position. The rack assembly and method of installation of the present invention relies on material forms such as flat sheet or plate metal, unshaped channel, angle shapes, and fasteners. At least one male hinge is incorporated in the rack structure which allows the equipment weight to be temporarily supported by the rack structure and provides an accessible equipment orientation for wiring. The male hinge(s) extends outwardly from the main body of the rack structure, permitting an equipment package to initially hang supported by the male hinge(s) along one of the package sides, vertically below the rack structure, and rotated about 90 degrees down from its final fixed position. This package position provides ease of access for a mechanic to reach the equipment electrical and mechanical connections. The mechanic can then perform cabling interconnect activities with unobstructed access to the equipment packages and greater access to the adjacent cable banks. When interconnect activities are complete and testing performed, the mechanic rotates the package about 90 degrees to its final fixed position.

The equipment package comprises the necessary equipment pre-mounted on a flat plate structure of suitable material for strength and weight, optional stiffener member (s), pre-bored equipment fastener holes which may be through bores or threaded bores, and at least one female hinge member. The at least one female hinge member comprises at least one opening in the flat plate to receive the at least one male hinge of the rack structure. A rod of about one quarter inch (0.64 mm) diameter spans the female hinge opening(s) and provides the axis of rotation for the equipment package about the male hinge(s).

In another aspect of the invention, a plurality of quick turn, eg. one-quarter turn, fasteners are provided to improve both installation and subsequent removal of the equipment package. These fasteners permit a single mechanic to swing the equipment package up to its installed position and, while holding the package in position, fasten the package to the rack structure. The rack structure is provided with mating fastener ports for the one-quarter turn fasteners. Similarly, for subsequent maintenance work, a single mechanic can support the weight of the equipment package while simultaneously releasing the quarter-turn fasteners.

The hinge(s) may also be reversed, wherein the male hinge(s) form a structural part of the equipment package, and the female hinge(s) form a structural part of the rack structure. Additionally, the hinge design may be varied in the form of a male pin which slides into the female hinge, or a door hinge design employing female type hinge members on both the rack structure and the flat plate of the equipment package may be used with a separate male pin joining the two female hinges. The female hinge(s) may also incorporate flat or rolled plate in place of the tack welded rod to simplify the hinge design.

In another aspect of the invention, an upper plate, forming a drip shield for the equipment package below, may form an integral part of the rack structure, or the drip shield may be incorporated as the flat plate of the equipment package.

The equipment package may also comprise a box-like enclosure surrounding the equipment mounted therein. In this aspect of the invention the equipment package, when swung up to its installed position, contacts an opposed plate section mounted to the rack structure, providing total enclosure of the equipment. Wiring clearance openings are employed for this aspect, with the potential for hermetically sealing the enclosure.

Further areas of applicability of the present invention will become apparent from the detailed description provided hereinafter. It should be understood that the detailed description and specific examples are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 3B is a plan view of the female hinge design plate and rod assembly of FIG. 3A;

FIG. 3C is an elevational view of the female hinge design taken along section line II—II of FIG. 3B;

FIG. 4 is a section view showing an alternative hinge design reversing the orientation of the male hinge of FIG. 3A;

FIG. 5 is a plan view of an equipment plate similar to FIG. 3B, eliminating the rod;

FIG. 7 is a perspective view of an alternative rack design providing for complete enclosure of the equipment and a further alternative hinge design;

DETAILED DESCRIPTION OF THE PREFERRED EMBODIMENTS

The following description of the preferred embodiment(s) is merely exemplary in nature and is in no way intended to limit the invention, its application, or uses.

Figure 1:
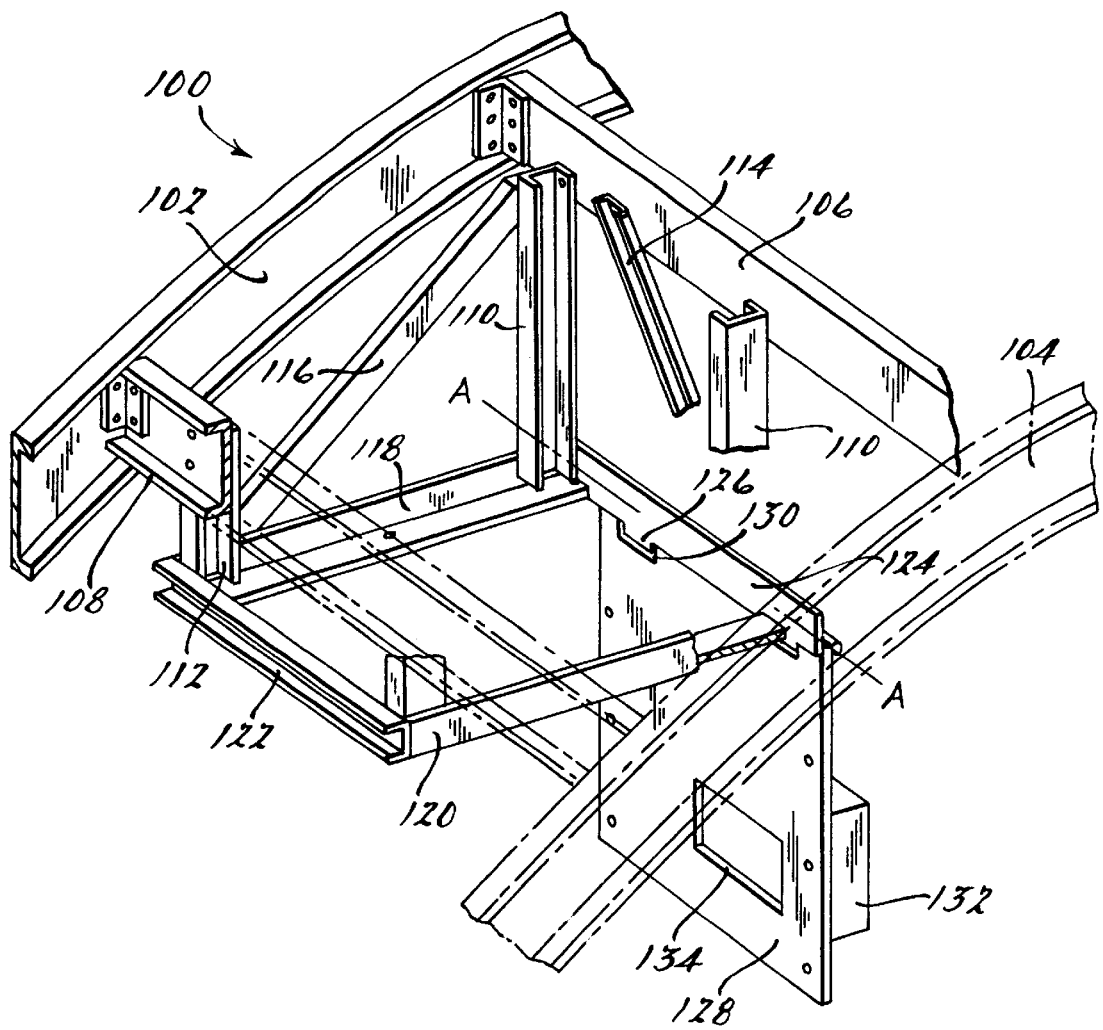
FIG. 1 is a partial perspective view of the invention showing the equipment support plate in the working suspended position.

FIG. 1 shows rack assembly 100 in accordance with a preferred embodiment of the present invention, disposed between aircraft frames 102 and 104, inboard intercostal 106, and outboard intercostal 108. Rack assembly 100 is shown having long vertical rails 110 on the inboard side of rack assembly 100, and short vertical rails 112 on the outboard side of rack assembly 100. Two diagonal stiffeners 114 (only the inboard stiffener is shown in FIG. 1 for clarity) are used to minimize forward/aft deflections of rack assembly 100. Similarly, two diagonal braces 116 (only the forward brace is shown in FIG. 1 for clarity) are used to minimize inboard/outboard deflections of rack assembly 100.

Forward angle 118 and aft angle 120 form the lower forward and aft corners respectively of rack assembly 100. Channel member 122 forms the lower outboard corner member of rack assembly 100. A modified channel, forming a hinge channel 124 is shown in FIG. 1, as the lower inboard corner member of rack assembly 100. Hinge channel 124 has at least one and preferably two male hinge members 126 extending inboard from the lower inboard corner of rack assembly 100. For clarity, two male hinge members 126 will be described in further detail. Plate 128 provides at least one and preferably two female hinge members 130. For clarity, two female hinge members 130 will be described in further detail. Female hinge members 130 each comprise an opening in plate 128, and are together spaced and sized to accept male hinge members 126. A space envelope for equipment 132 supported by rack assembly 100 is shown attached to plate 128.

FIG. 1 further shows plate 128 in a working suspended position, wherein female hinge members 130 rotatably engage male hinge members 126, and the weight of plate 128 with attached equipment 132 is gravity suspended from both the male hinge members 126 and hinge channel 124. From the working suspended position shown in FIG. 1, a mechanic can pull connecting ends of adjacently supported wireway wires (not shown) directly to equipment 132, or through one or more clearance openings 134 provided in plate 128 for this purpose.

Figure 2:
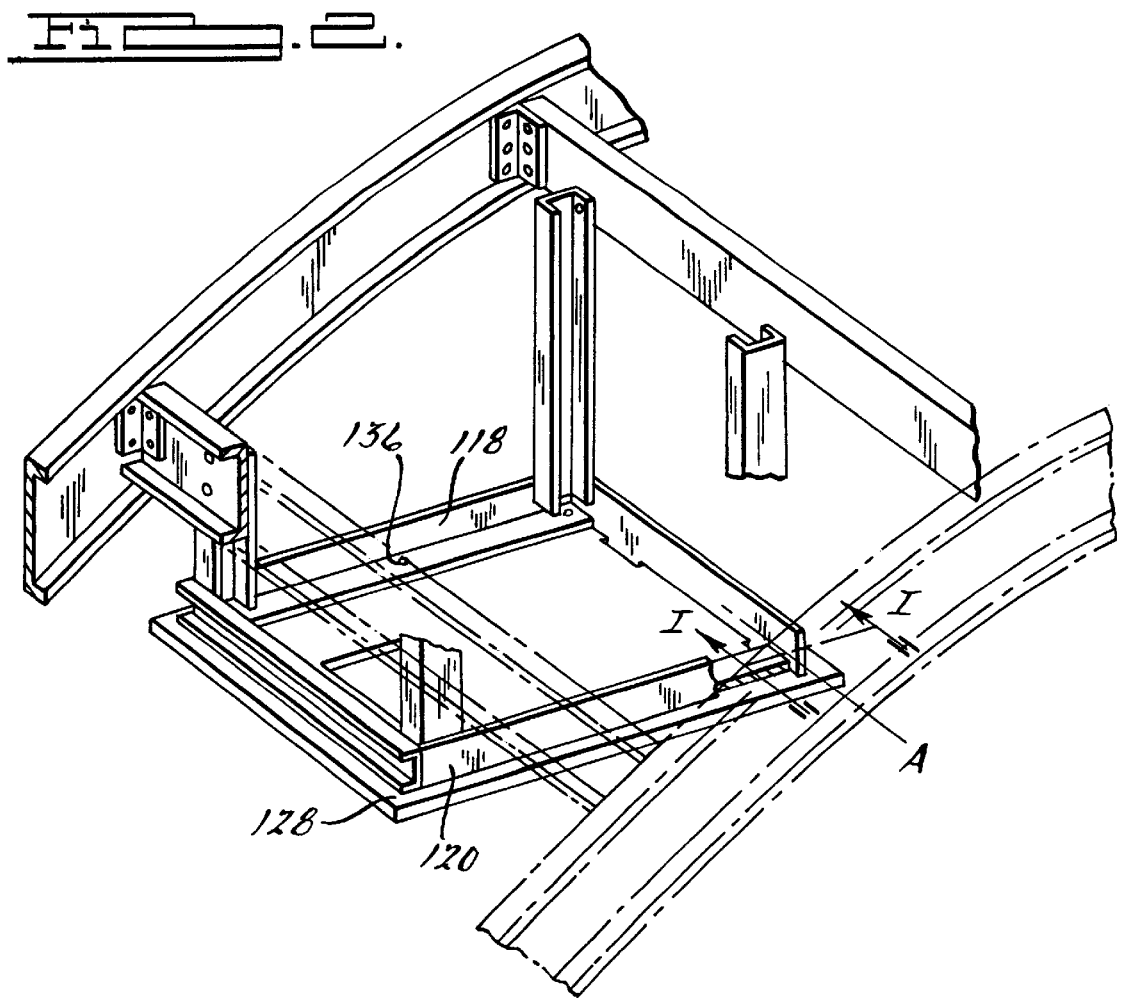
FIG. 2 is a partial perspective view of the arrangement of FIG. 1 showing both the equipment support plate and typical equipment in the stored fixed position.

Referring to FIG. 2, upon completion of wiring and system interconnections to equipment 132 in the working suspended position previously shown in FIG. 1, plate 128 with supported equipment 132 is rotated about ninety (90) degrees, about axis of rotation A, to the stored fixed position shown in FIG. 2. In the stored fixed position, the mechanic fastens plate 128 to both forward angle 118 and aft angle 120 using mechanical fasteners 136. Mechanical fasteners for fastening plate 128 are preferably one-quarter (¼) turn fasteners, but may be of any suitable type of removable fastener including screws, bolts, and studs with nuts. Quarter turn fasteners are preferred to permit one hand operation by a mechanic who simultaneously manually supports plate 128. Forward angle 118 and aft angle 120 are both premachined to accept mechanical fasteners 136, with fastener spacing corresponding to fastener spacing on plate 128.

Figure 3A:
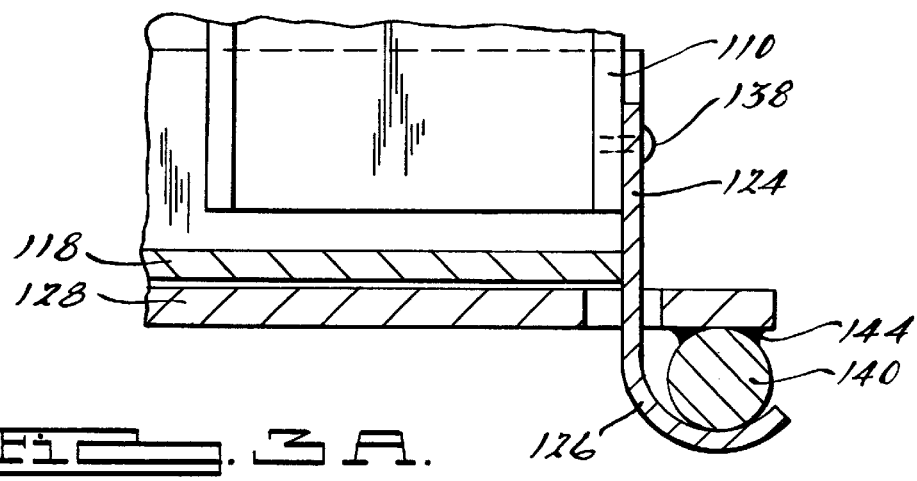
FIG. 3A is a section view taken along section line I—I of FIG. 1, showing an exemplary hinge design.

Referring now to FIGS. 3A, 3B, and 3C, an example of a hinge combination is shown. FIG. 3A is a section view taken along Section line I—I of FIG. 1. FIG. 3B is a plan view of plate 128. FIG. 3C is an elevational view of plate 128 taken along Section line II—II of FIG. 3B. FIG. 3A shows male hinge member 126 fastened to the outward facing flange of long vertical rail 110 by at least one fastener 138. Fastener 138 may be a bolt, rivet, or hole filling fastener. Plate 128 is shown in FIG. 3A in the stored fixed position. A rod 140 is tack welded to plate 128 providing axis of rotation "A" for plate 128. This detail is better shown in FIGS. 3B and 3C.

FIG. 3B shows at least one and preferably two cutouts 142 machined in plate 128, each having a width "W" equaling the width of male hinge member 126 plus clearance for rotation. Cutouts 142 permit plate 128, with any associated pre-mounted equipment 132, to extend over the looped free end, as shown in FIG. 1, of male hinge member 126. Height "X" of cutout 142 is determined by the material thickness of male hinge member 126 plus a clearance allowance. Typical locations for mechanical fasteners 136 are also shown. The length of rod. 140 is about equal to the width "Y" of plate 128. Rod 140 length may be shorter than width "Y" of plate 128, providing the length of rod 140 provides for. at least a tack weld at tack weld positions 146 and 148 respectively.

FIG. 3C shows the positioning of rod 140 on plate 128 and one of a plurality of supporting tack welds 144 attaching rod 140 to plate 128.

FIG. 4 is a section view similar to FIG. 3A, but with the orientation of male hinge member 126 reversed from the FIG. 3A orientation. The principal difference between FIGS. 3A and 4 is the method of installation differs in that plate 128 in FIG. 4 would be initially hung from male hinge member 126 by inserting rod 140 end of plate 128 into. the clearance area "Z" provided between forward, angle. 118 and male hinge member 126, and simultaneously into a similar clearance area between aft angle 120 and male hinge member 126 (not shown).

FIG. 5 is a plan view of plate 228 showing cutouts 242, both similar to plate 128 and cutouts 142 of FIG. 3B. FIG. 5 differs from FIG. 3B as an example of a simplified version of manufacturing female hinge members. Rod 140 is omitted from the modified female hinge members 230. Plate 228 has cutouts 242 sized similarly to cutouts 142 of FIG. 3B, however, cutouts 242 are spaced to retain thickness "T" as a substitute for rod 140. The axis of rotation "B" of plate 228 is about the center of thickness "T".

Figure 6:
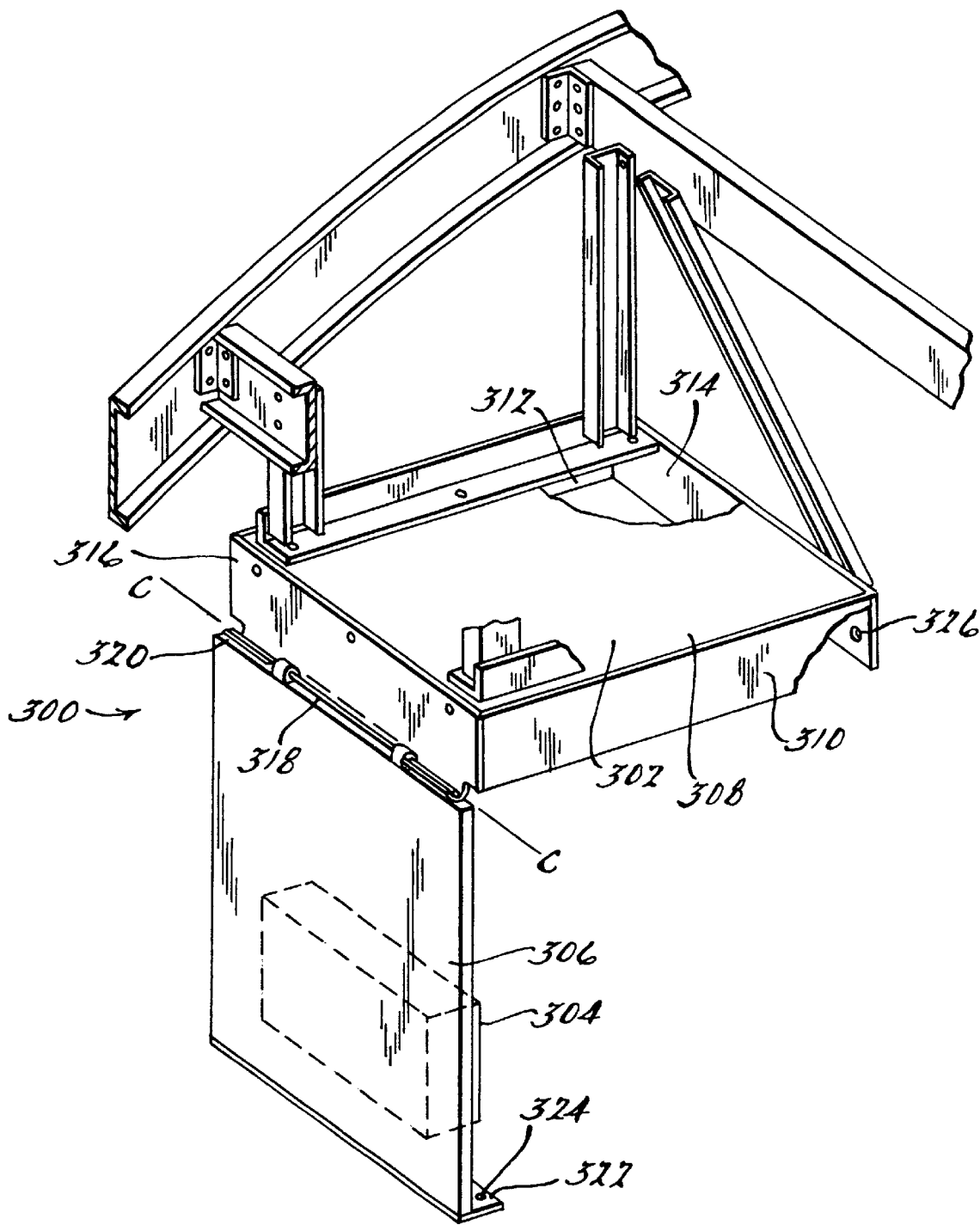
FIG. 6 is a perspective view of a rack design having a drip tray.

Referring now to FIG. 6, structural members of rack assembly 300 are similar to members shown in FIG. 1, as rack assembly 100, and therefore only the differences will be discussed in further detail herein. Rack assembly 300 provides a pre-positioned drip tray 302, providing overhead protection of equipment 304 mounted on plate 306. Drip tray 302 comprises an assembly of top plate 308, first and second side walls 310 and 312, respectively, end wall 314, and hinge channel 316. Inside corner brackets (not shown) or similar hardware may be used to join or reinforce the corner joints of drip tray 302. Also, first and second side walls, 310 and 312, respectively, and end wall 314 may be bent from a single piece of material and subsequently joined to hinge channel 316.

Plate 306, has rod 318 and one or more cutouts 320 at a first end of plate 306, similar to the configuration shown in FIG. 3B. At the opposed second end of plate 306, latch plate 322 is mounted, providing a surface for location of mechanical fasteners 324, which are similar to mechanical fasteners 136.

Functionally, plate 306, having rod 318 and one or more cutouts 320, similar to the configuration shown in FIG. 3B, will be initially hung in a working suspended position. Upon completion of wiring interconnections, the mechanic will swing plate 306 about ninety (90) degrees about axis of rotation "C" to a fixed supported position of plate 306, similar to FIG. 2. Mechanical fasteners 324 join with pre-located fastener mating holes 326 in end wall 314 to join latch plate 322 with end wall 314 in the fixed supported position.

Referring now to FIG. 7, another version of the present invention is shown. In this configuration, rack assembly 400 provides a box structure having one open end, and within the box, equipment is pre-mounted. A flat plate is pre-mounted to the rack structure in the aircraft, similar to the attachment of drip tray 302 of FIG. 6. The box structure is hinged to the flat plate, such that when rotated to the fixed stored position, the equipment is completely enclosed. An alternate hinge detail Is also shown in FIG. 7. A description of the preferred use of two hinges is provided.

Structural members of rack assembly 400 are similar to members shown in FIG. 1, rack assembly 100, and therefore only the differences will be discussed in further detail herein. Rack assembly 400 provides a pre-positioned plate 402, providing overhead protection of equipment 404 mounted therefrom in box structure 406. Box structure 406 comprises an assembly of bottom plate 408, first side wall 410 and second side wall 412, and first end wall 414, and second end wall 416. Inside corner brackets (not shown) or similar hardware may be used to join or reinforce the corner joints of box structure 406. Also, first and second side walls, 410, 412, together with first and second end walls 414, 416 may be bent from a single piece of material. A reinforcing flange 418 provides perimeter stiffness for box structure 406. Reinforcing flange 418 may be formed of a separate piece and subsequently fastened or tack welded to first and second side walls 410 and 412, and first and second end walls 414 and 416, or reinforcing flange 418 may be formed from the material of first and second side walls 410 and 412, and first and second end walls 414 and 416, and bent or rolled to form the flange shape shown.

Plate 402 has at least one and preferably two female hinge member(s) 420 attached or integrally formed at a first end of plate 402. At the opposed second end of plate 402, latch plate 422 is disposed, perpendicular to plate 402. Latch plate 422 provides a surface for location of mechanical fasteners 424, which are similar to mechanical fasteners 136.

Box structure 406 provides at least one and preferably two male hinge member(s) 426 disposed on an outward facing surface of first end wall 414, adjacent to reinforcing flange 418. Male hinge members 426 are dimensionally positioned to slidably engage female hinge members 420 via hinge pin 428. Hinge plate 430 fixedly supports hinge pin 428, and hinge plate 430 itself is then fixedly attached to first end wall 414 with fasteners (not shown).

Functionally, box structure 406 will be initially hung in a working suspended position by slidably engaging male hinge members 426 and female hinge members 420. Upon completion of wiring interconnections, the mechanic will swing box structure 406 about ninety (90) degrees about axis of rotation D to a fixed supported position of box structure 406, similar to FIG. 2. Mechanical fasteners 424 join with pre-located fastener mating holes 432 in second end wall 416 to join latch plate 422 of plate 402 to second end wall 416 and thus fasten box structure 406 in the fixed supported position. Additionally, one or more wiring through bores 434 are provided to route equipment wiring (not shown) into box structure 406. Wiring through bores 434 may be subsequently hermetically sealed. Box structure 406 and equipment 404 together form an equipment package.

Figure 8C:
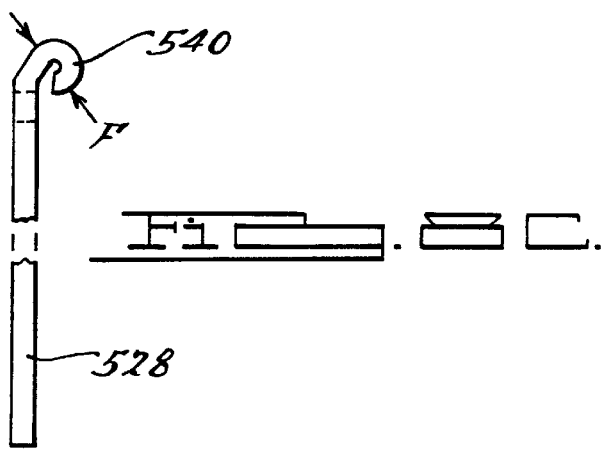
FIG. 8C is an elevational view of the female hinge design taken along section line III—III of FIG. 8B.
Figure 8B:
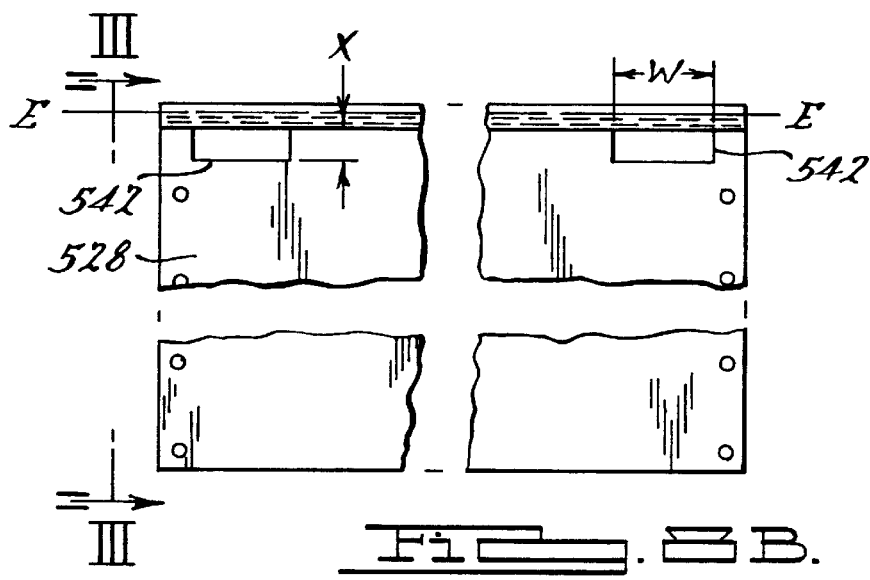
FIG. 8B is a plan view of the female hinge design of FIG. 8A.
Figure 8A:
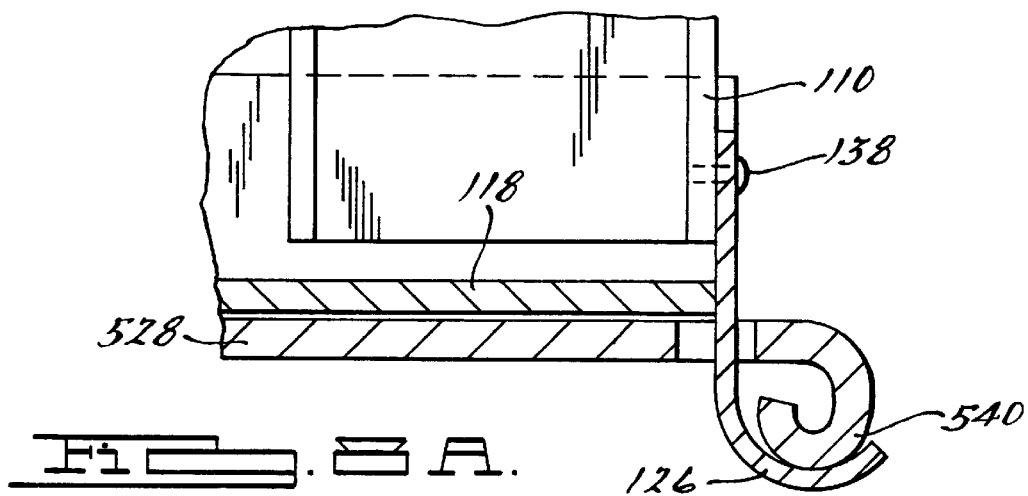
FIG. 8A is a section view taken along section line I—I of FIG. 1, similar to FIG. 3A, showing rolled plate replacing the rod and tack weld of FIG. 3A.

Referring now to FIGS. 8A, 8B, and 8C, a further example of a hinge combination is shown. FIG. 8A is a section view taken along Section line I—I of FIG. 1, similar to FIG. 3A. FIG. 8B is a plan view of plate 528 (similar to plate 128). FIG. 8C is an elevational view of plate 528 taken along Section line III—III of FIG. 8B. FIG. 8A shows male hinge member 126 fastened to the outward facing flange of long vertical rail 110 by at least one fastener 138 as previously described for FIG. 3A. Plate 528 is shown in FIG. 8A in the stored fixed position. A rolled end section 540 (substituted for rod 140 of FIG. 3A), is rolled from extra stock length provided on plate 528 for this purpose. Rolled end section 540 provides. axis of rotation "E" for plate 528 as shown in FIG. 8B.

FIG. 8B shows at least one and preferably two cutouts 542 formed in plate 528, each having a width "W'", similar to width "W" of FIG. 3B, equaling the width of male hinge member 126 plus clearance for rotation. Cutouts 542 permit plate 528, with any associated pre-mounted equipment 132, to extend over the looped free end, (similar to plate 128 as shown in FIG. 1), of male hinge member 126. Height "X'" of cutout 542, similar to height "X" of FIG. 3B, is determined by the material thickness of male hinge member 126 plus a clearance allowance. Typical locations for mechanical fasteners 136 are also shown. The length of rolled end section 540 is about equal to the width "Y'" of plate 528. The width "Y" of plate 128 and the width "Y'" of plate 528 are about equal.

FIG. 8C shows the positioning and detail of rolled end section 540 on plate 528. Diameter "F" of rolled end section 540 is about equal to the diameter of rod 140 plus the thickness (not shown) of plate 128 of FIG. 3A.

The plate thickness for plate 128 and plate 528, the dimensions of diameter "F" and the diameter of rod 140, and the curvature of male hinge member 126 may be varied to suit a weight of any given equipment package.

The invention provides the advantages of an improved method of installing equipment racks on aircraft, by providing a temporary support position accessible for wiring equipment connections. A single mechanic can both support and mount equipment, thus reducing installation time and cost.

The description of the invention is merely exemplary in nature and, thus, variations that do not depart from the gist of the invention are intended to be within the scope of the invention. For example, locations of the male and female hinges may be reversed, alternatives other than those described herein for a design of a male or female hinge section may be employed, or the hinges may be located on any of the sides formed by the rack structure, eg. the hinges may be located to center the axis of rotation of the equipment package on the forward, aft, inboard, or outboard facing side of the rack structure to suit accessibility to the equipment. Fastener location may also vary to suit accessibility to the fasteners or for surrounding installation clearance. Such variations are not to be regarded as a departure from the spirit and scope of the invention.

What is claimed is:

1. A method for supporting equipment on an aircraft equipment rack comprising the steps of:
   constructing an equipment rack;
   installing a first half hinge on the equipment rack;
   providing an equipment package having a second half hinge;
   engaging the equipment package second half hinge with the equipment rack first half hinge to provide an equipment package temporary support position; and
   making system connections to the equipment package in the temporary support position.

2. The method of claim 1 further comprising the steps of:
   providing attachment members on the equipment rack; and
   fixedly connecting the attachment members to a frame structure of the aircraft prior to engagement of the equipment package second half hinge.

3. The method of claim 1 further comprising the steps of:
   providing the system connections from an aircraft wiring assembly; and
   routing the aircraft wiring assembly to the equipment package temporary support position.

4. The method of claim 3 further comprising the steps of:
   swinging the equipment package through an arc of about ninety degrees from the temporary support position to an equipment package installed position; and
   mechanically fastening the equipment package in the installed position to the equipment rack.

5. The method of claim 4 further comprising the steps of:
   providing quarter turn fasteners; and
   rotating the quarter turn fasteners to mechanically fasten the equipment package in the installed position to the equipment rack.

6. The method of claim 2 further comprising the steps of:
   providing a drip shield; and
   fastening the drip shield to the equipment rack.

7. The method of claim 1 further comprising the steps of:
   providing a flat plate having fastener location points to connect with mating fasteners of the equipment package;
   fastening the equipment package to the flat plate; and
   installing a box shaped enclosure on the flat plate to surround the equipment package.

8. The method of claim 1 further comprising the steps of:
   forming the first half hinge as a male hinge; and
   constructing the second half hinge as a female hinge dimensioned to internally accept the male hinge.

9. The method of claim 1 further comprising the steps of:
   constructing the first half hinge as a female hinge; and
   forming the second half hinge as a male hinge to mate with the female hinge.

10. A method to access equipment mountable on an aircraft equipment rack comprising the steps of:
    constructing an equipment rack structure having attachment members and a first half hinge;
    fixedly connecting the attachment members to a frame structure of the aircraft;
    providing a flat plate having a second half hinge;
    mounting an equipment set on the flat plate;
    forming an equipment package from the equipment set and the flat plate;
    engaging the second half hinge to the first half hinge to form an axis of rotation for the equipment package.

11. The method of claim 10 further comprising the steps of:
    selecting as the equipment set an antenna equipment package; and
    installing an antenna;
    positioning the antenna equipment package within a radial distance of about two feet from the antenna.

12. The method of claim 10 further comprising the steps of:
    providing wiring terminal connectors from a wiring bank; and
    connecting the wiring terminal connectors to the equipment package; and
    rotating the equipment package about the axis of rotation to a fixed position.

13. The method of claim 12 further comprising the steps of:

installing quarter turn fasteners; and rotating the quarter turn fasteners to mechanically fasten the equipment package in the fixed position.

14. A hinged aircraft equipment rack comprising:

an equipment rack structure comprising attachment members;

the attachment members fixedly connected to a frame structure of the aircraft;

a first half hinge attached to the equipment rack structure;

a flat plate;

an equipment package fixedly attached to the flat plate;

a second half hinge integrally connected to the flat plate;

the second half hinge rotatably engaged to the first half hinge to form an axis of rotation for the equipment package; and the axis of rotation is selected to provide the equipment package in one of a working suspended position and a stored fixed position.

15. The hinged aircraft equipment rack of claim 14 comprising:

mechanical fasteners fixedly engaged to restrain the equipment package in the stored fixed position.

16. The hinged aircraft equipment rack of claim 15 wherein said mechanical fasteners are selected from the group consisting of: one quarter turn fasteners, bolts, screws, and stud bolts.

17. The hinged aircraft equipment rack of claim 14 wherein the equipment rack structure further comprises a drip tray fixedly joined to the attachment members.

18. The hinged aircraft equipment rack of claim 16 wherein the flat plate further comprises a box shaped enclosure to surround the equipment package.

19. The hinged aircraft equipment rack of claim 13 comprising:

the first half hinge formed as a male hinge; and the second half hinge formed as a female hinge dimensioned to internally accept the male hinge.

20. The hinged aircraft equipment rack of claim 13 comprising:

the first half hinge formed as a female hinge; and the second half hinge formed as a male hinge to mateably engage the female hinge.

* * * * *